United States Patent
Rhee

(10) Patent No.: US 9,799,634 B2
(45) Date of Patent: Oct. 24, 2017

(54) DISPLAY DEVICE USING SEMICONDUCTOR LIGHT EMITTING DEVICE

(71) Applicant: LG ELECTRONICS INC., Seoul (KR)

(72) Inventor: Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/774,571

(22) PCT Filed: Mar. 26, 2014

(86) PCT No.: PCT/KR2014/002571
§ 371 (c)(1),
(2) Date: Sep. 10, 2015

(87) PCT Pub. No.: WO2014/163325
PCT Pub. Date: Oct. 9, 2014

(65) Prior Publication Data
US 2016/0043061 A1    Feb. 11, 2016

(30) Foreign Application Priority Data
Apr. 1, 2013    (KR) .................. 10-2013-0035299

(51) Int. Cl.
*H01L 25/075* (2006.01)
*H01L 23/00* (2006.01)
(Continued)

(52) U.S. Cl.
CPC .......... *H01L 25/0753* (2013.01); *H01L 24/95* (2013.01); *H01L 25/50* (2013.01);
(Continued)

(58) Field of Classification Search
CPC ..... H01L 25/0753; H01L 33/50; H01L 25/50; H01L 33/44; H01L 24/95;
(Continued)

(56) References Cited

U.S. PATENT DOCUMENTS 6,559,914 B1 * 5/2003 Jones ................ G02F 1/136209
349/111
6,965,361 B1    11/2005 Sheats et al.
(Continued)

FOREIGN PATENT DOCUMENTS

CN    101088140 A    12/2007
CN    101188219 A    5/2008
(Continued)

*Primary Examiner* — Bo Fan
(74) *Attorney, Agent, or Firm* — Birch, Stewart, Kolasch & Birch, LLP

(57) ABSTRACT

The present disclosure relates to a display device, and more particularly, to a display device using a semiconductor light emitting device. Such a display device using a semiconductor light emitting device may include a first substrate comprising an electrode portion, a conductive adhesive layer located on the first substrate, and a plurality of semiconductor light emitting devices at least part of which are buried in an upper region of the conductive adhesive layer to constitute individual pixels electrically connected to the electrode portion.

12 Claims, 10 Drawing Sheets

(51) Int. Cl.
*H01L 25/00* (2006.01)
*H01L 33/44* (2010.01)
*H01L 33/50* (2010.01)
H01L 33/56 (2010.01)
H05K 1/02 (2006.01)
H05K 1/18 (2006.01)
H05K 3/32 (2006.01)
H05K 3/46 (2006.01)

(52) U.S. Cl.
CPC .............. *H01L 33/44* (2013.01); *H01L 33/50* (2013.01); *H01L 33/56* (2013.01); *H01L 2924/0002* (2013.01); *H01L 2924/12041* (2013.01); *H05K 1/0274* (2013.01); *H05K 1/189* (2013.01); *H05K 3/323* (2013.01); *H05K 3/4682* (2013.01); *H05K 2201/10106* (2013.01); *H05K 2201/10128* (2013.01)

(58) Field of Classification Search
CPC ... H01L 2924/12041; H01L 2924/0002; H01L 33/56
USPC .............................. 438/108, 28; 257/443, 89
See application file for complete search history.

(56) References Cited

U.S. PATENT DOCUMENTS

| | | |
|---|---|---|
| 7,928,651 B2 | 4/2011 | Han et al. |
| 2005/0212007 A1 | 9/2005 | Daniels et al. |
| 2005/0285520 A1 | 12/2005 | Cok |
| 2006/0001362 A1 | 1/2006 | Han et al. |
| 2006/0250566 A1 | 11/2006 | Kim et al. |
| 2007/0023734 A1* | 2/2007 | Igarashi ............. C09K 11/7731 252/301.4 S |
| 2007/0059612 A1* | 3/2007 | Yoshioka ............. C09D 133/06 430/7 |
| 2009/0015130 A1* | 1/2009 | Kim ........................ H01J 63/06 313/486 |
| 2011/0037916 A1 | 2/2011 | Furukawa et al. |
| 2011/0175101 A1 | 7/2011 | Hatano et al. |
| 2012/0112215 A1 | 5/2012 | Chai et al. |
| 2014/0120401 A1* | 5/2014 | Shin .................... H01M 10/425 429/123 |

FOREIGN PATENT DOCUMENTS

| | | |
|---|---|---|
| CN | 102804040 A | 11/2012 |
| EP | 2423736 A1 | 2/2012 |
| JP | 2006-252876 A | 9/2006 |
| JP | 2008-159935 A | 7/2008 |
| KR | 10-2006-0115427 A | 11/2006 |
| KR | 10-2011-0029755 A | 3/2011 |
| KR | 10-2011-0085904 A | 7/2011 |
| KR | 10-2012-0074916 A | 7/2012 |
| RU | 2476036 C2 | 2/2013 |
| TW | 201230408 A1 | 7/2012 |

* cited by examiner

[Fig. 1]
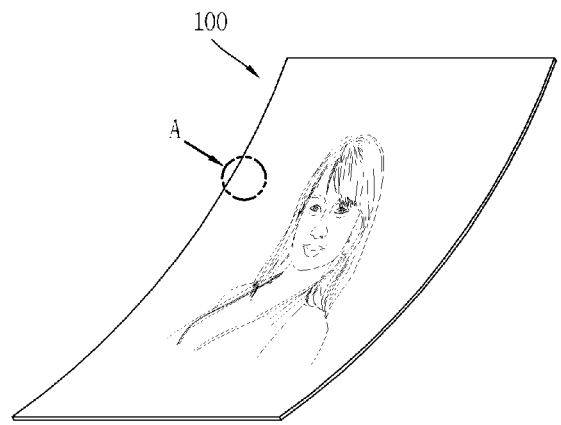
[Fig. 2]
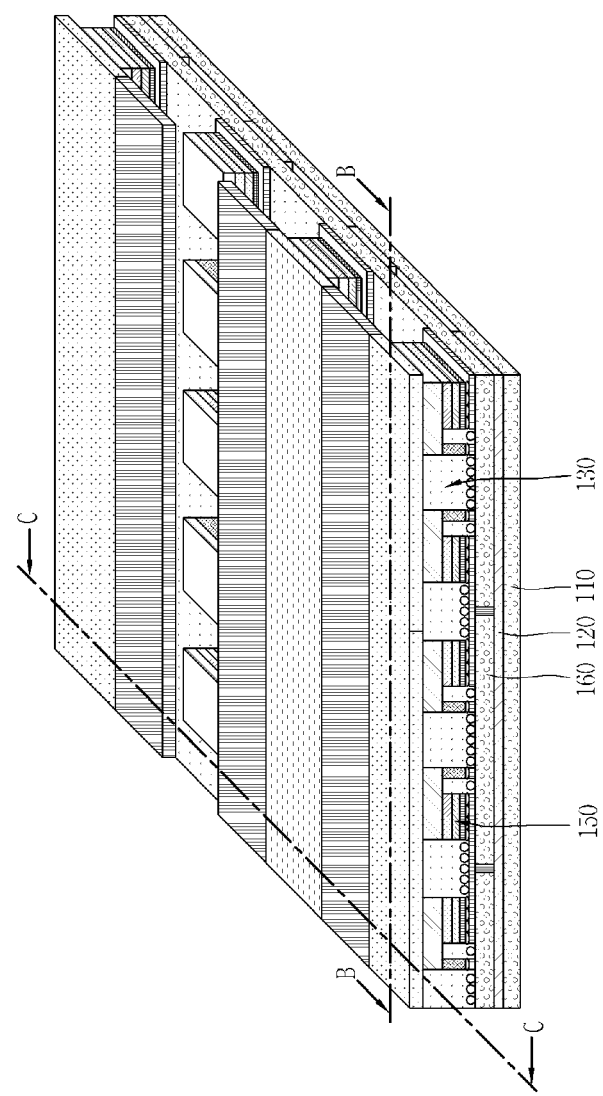

[Fig. 3a]
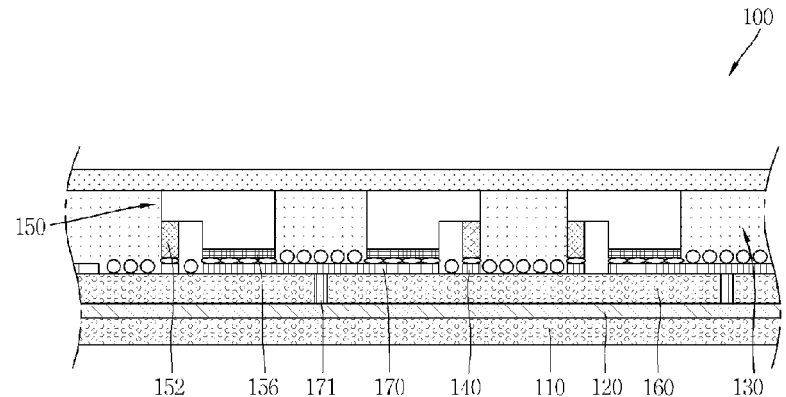
[Fig. 3b]
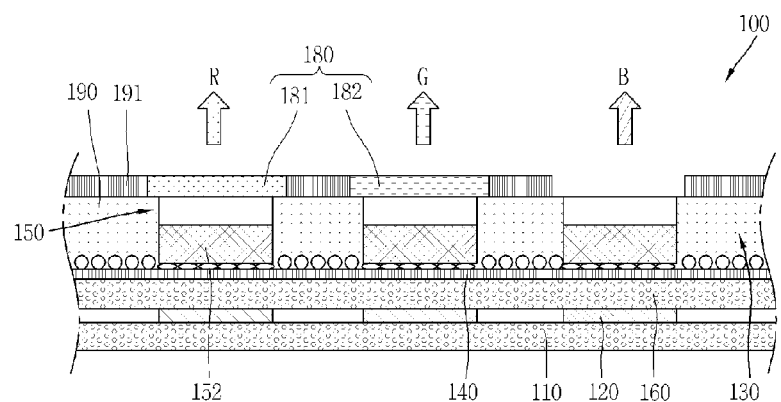
[Fig. 4]
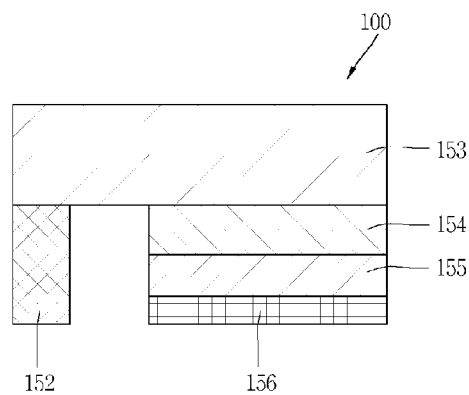
[Fig. 5a]
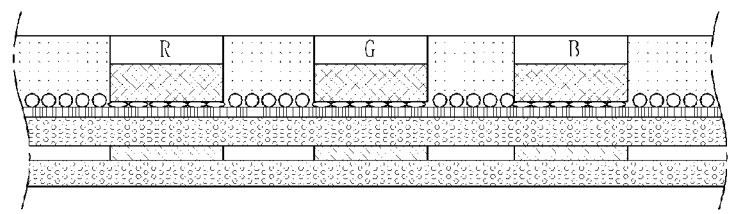

[Fig. 5b]
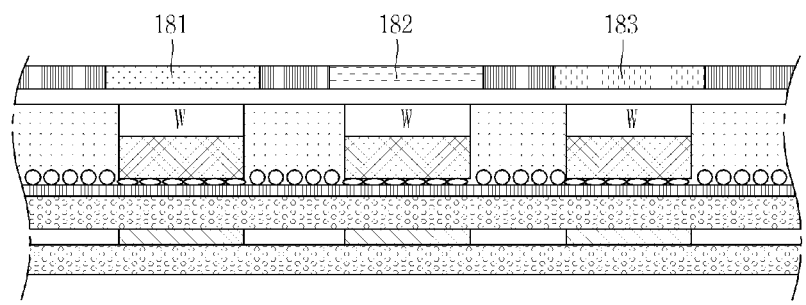
[Fig. 5c]
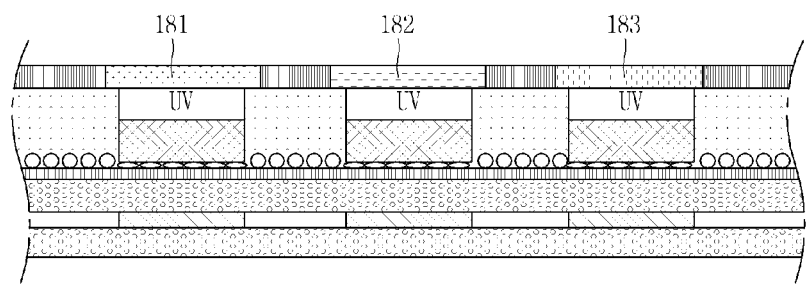

[Fig. 6]
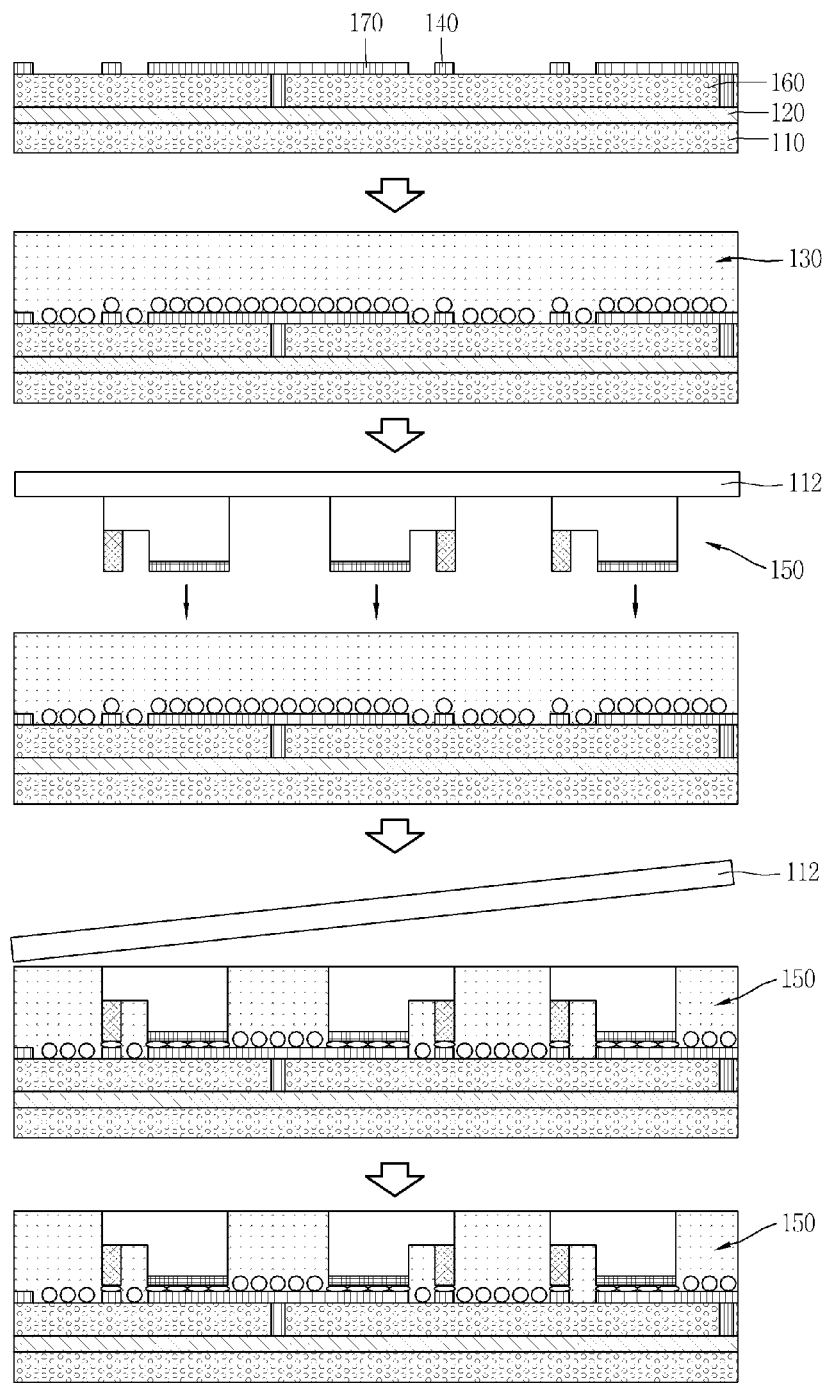

[Fig. 7]
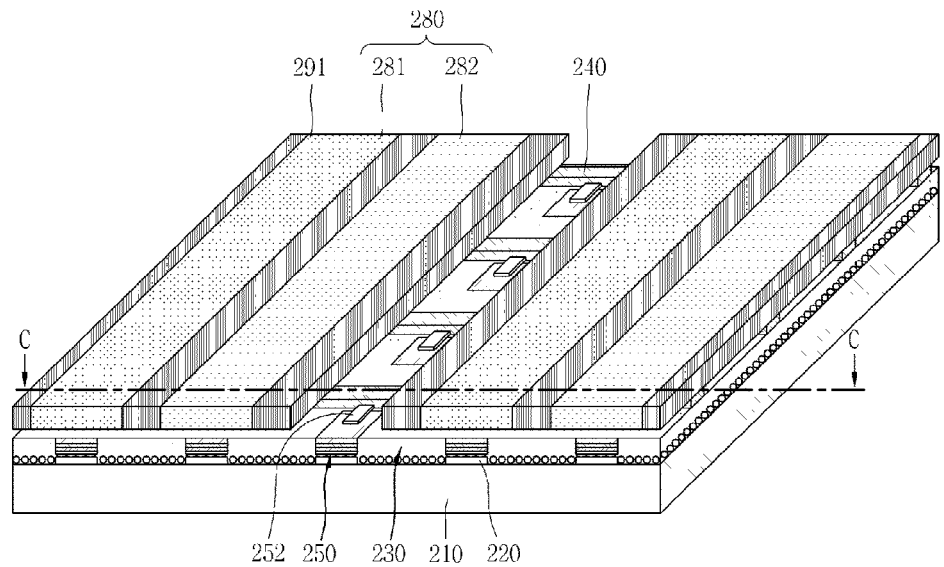
[Fig. 8]
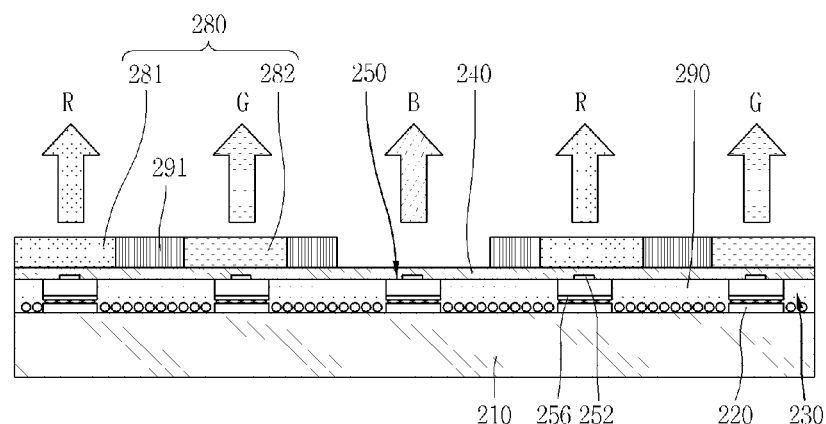
[Fig. 9]
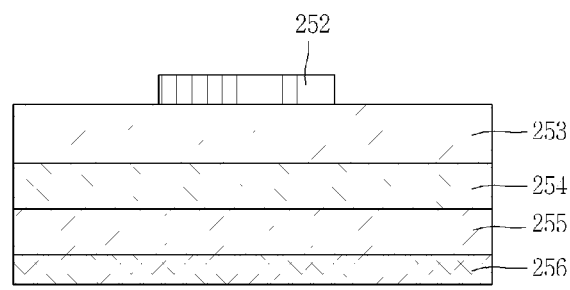

[Fig. 10]
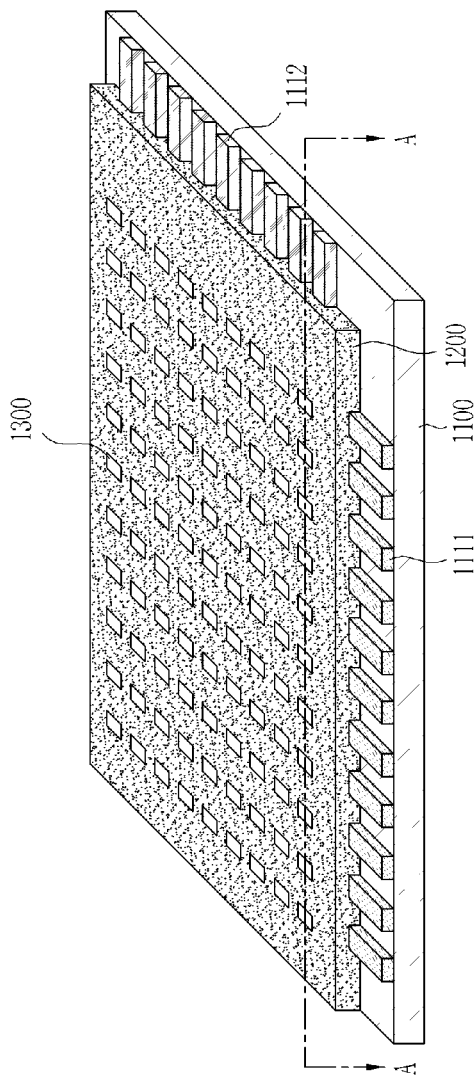
[Fig. 11]
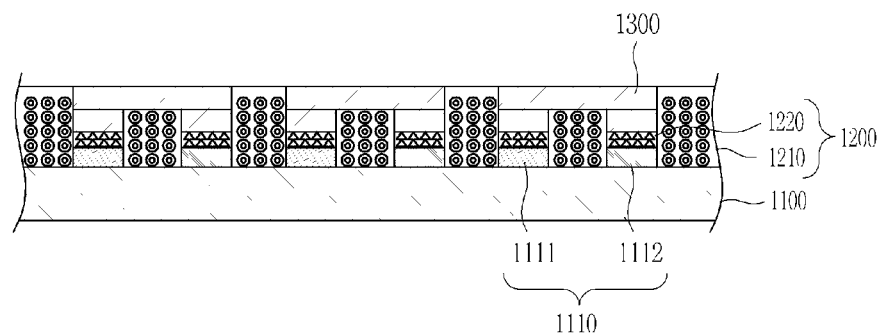

[Fig. 12]
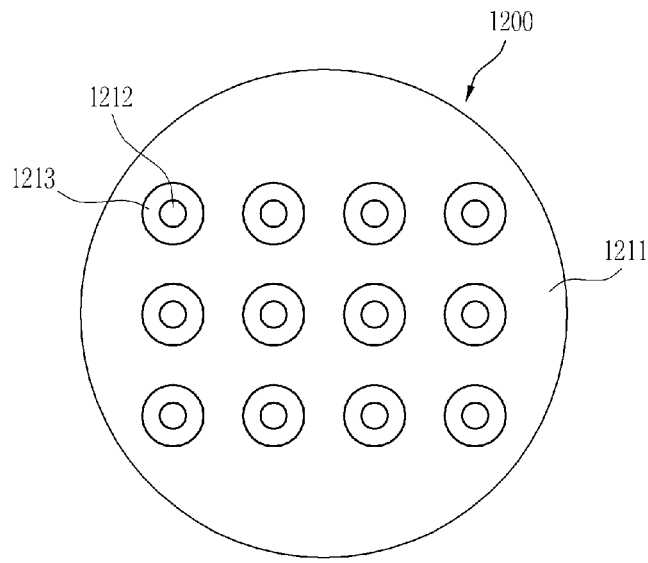
[Fig. 13]
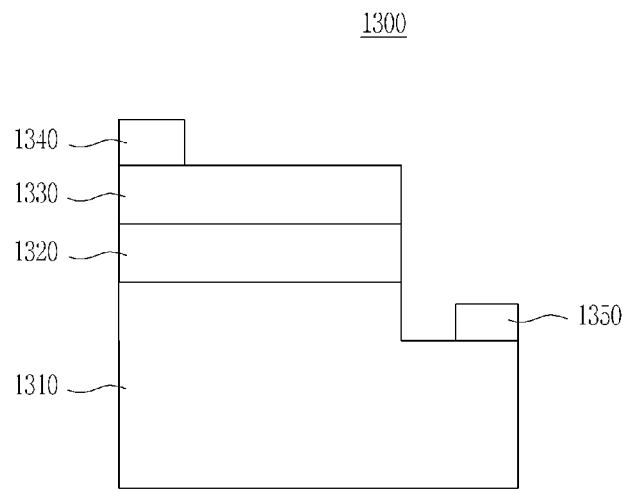
[Fig. 14]
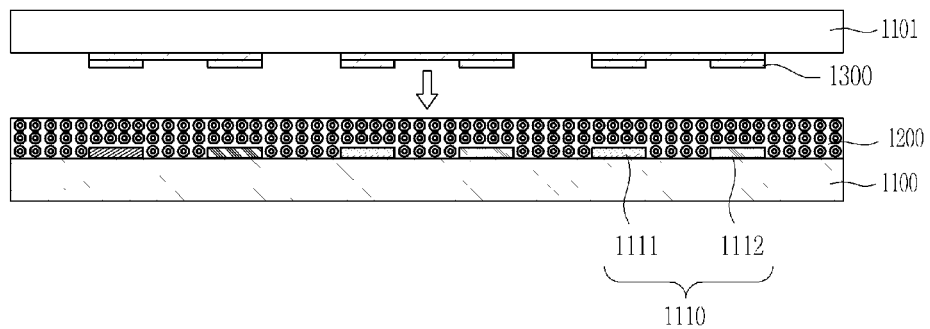

[Fig. 15]
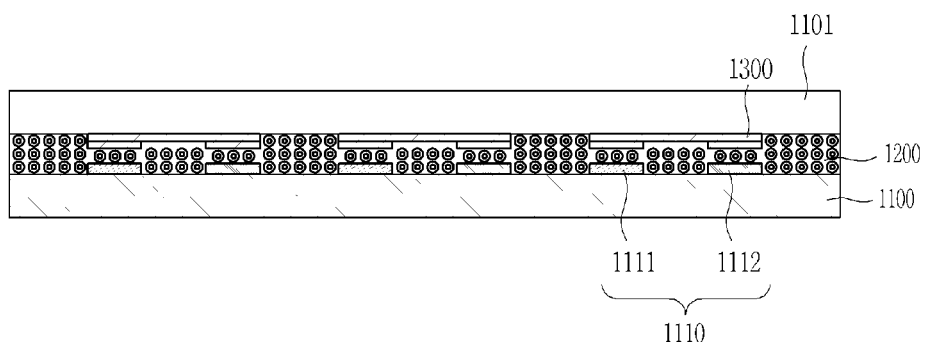
[Fig. 16]
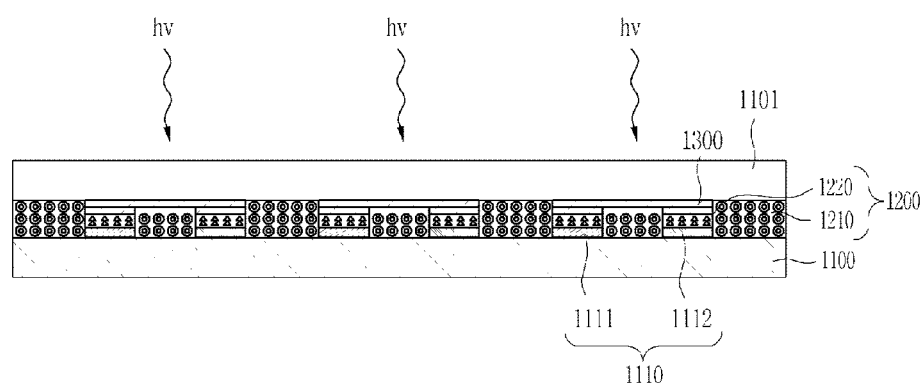
[Fig. 17]
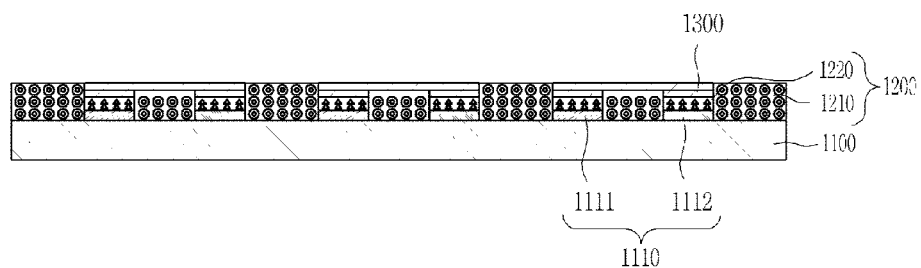

[Fig. 18]
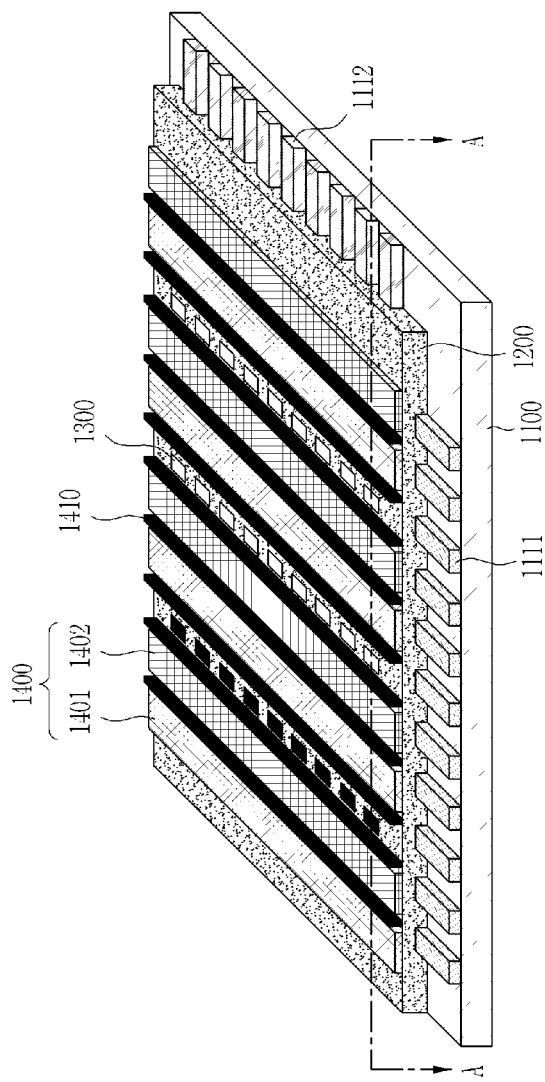
[Fig. 19]
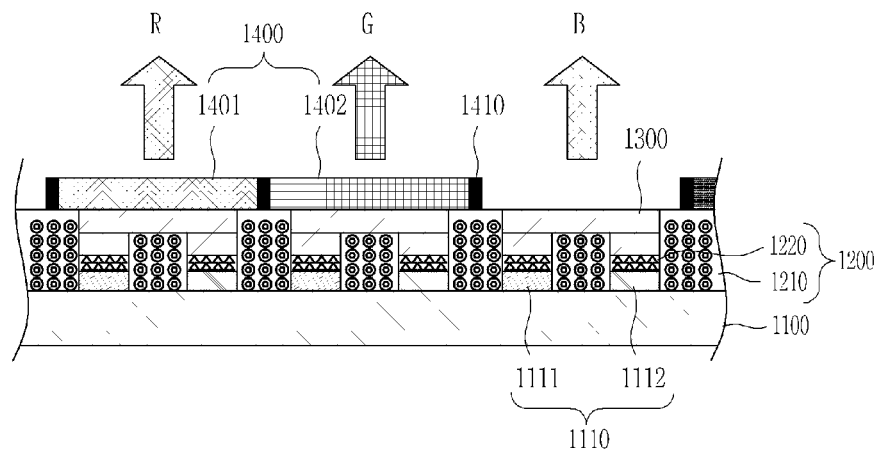

[Fig. 20]
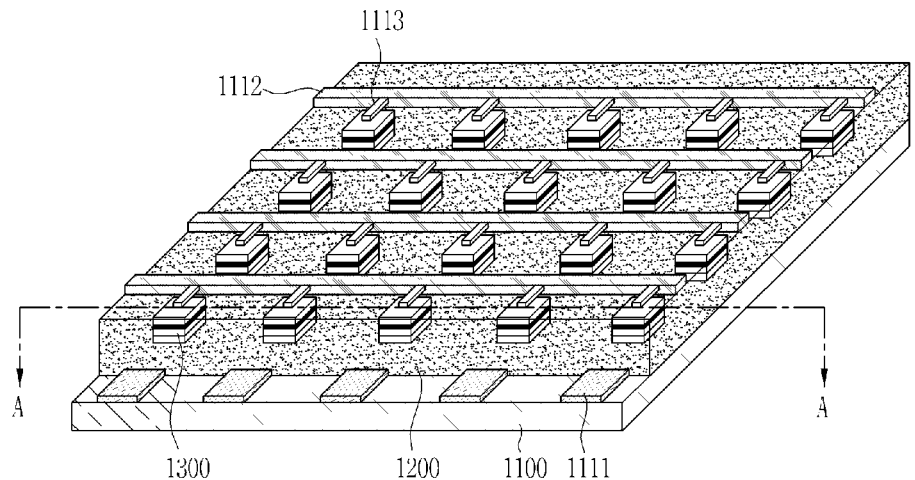
[Fig. 21]
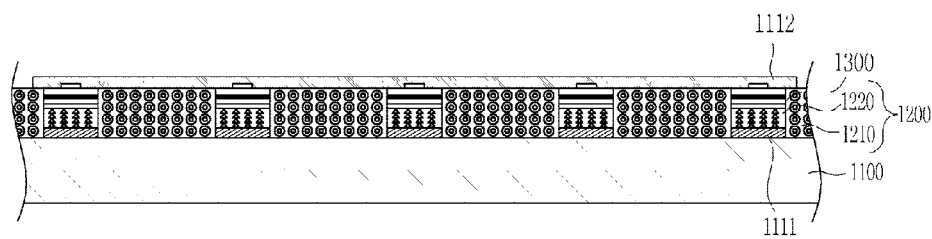
[Fig. 22]
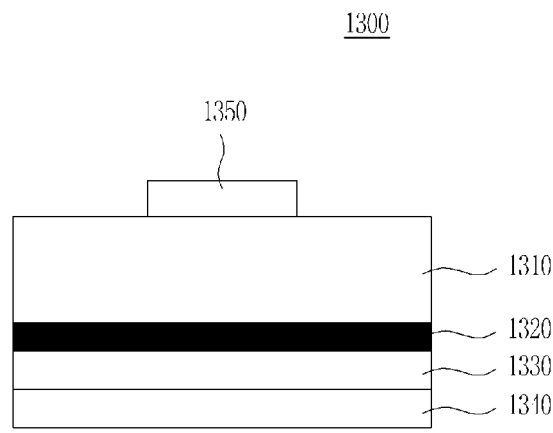

DISPLAY DEVICE USING SEMICONDUCTOR LIGHT EMITTING DEVICE

TECHNICAL FIELD

The present disclosure relates to a display device, and more particularly, to a display device using a semiconductor light emitting device.

BACKGROUND ART

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

Furthermore, in addition, it may be possible to conceive the structure of connecting lines suitable for a flexible display using semiconductor light emitting devices.

DISCLOSURE OF INVENTION

Technical Problem

An object of the present disclosure is to provide a new type of display device with flexibility, which is different from the related art.

Another object of the present disclosure is to provide a display device capable of simplifying the process of forming a partition wall between semiconductor light emitting devices contained therein.

Solution to Problem

In order to accomplish the foregoing task, an aspect of the present disclosure provides a display device using a semiconductor light emitting device.

Such a display device using a semiconductor light emitting device may include a first substrate comprising an electrode portion, a conductive adhesive layer located on the first substrate, and a plurality of semiconductor light emitting devices at least part of which are buried in an upper region of the conductive adhesive layer to constitute individual pixels electrically connected to the electrode portion, Furthermore, the conductive adhesive layer may contain a non-transparent resin to block light between the semiconductor light emitting devices.

The non-transparent resin may include a black or white resin. Furthermore, the conductive adhesive layer may be tinted.

In order to accomplish the foregoing task, another aspect of the present disclosure provides a method of fabricating a display device using a semiconductor light emitting device.

Such a method of fabricating a display device may include adhering an anisotropic conductive film containing a non-transparent resin to a first substrate containing an electrode portion, allowing a second substrate located with a plurality of semiconductor light emitting devices corresponding to the location of the electrode portion and constituting individual pixels to be disposed such that the electrode portion faces the semiconductor light emitting device, thermally compressing the first substrate to the second substrate to bury at least part of the semiconductor light emitting devices in an upper region of the anisotropic conductive film, and removing the second substrate.

According to the present disclosure having the foregoing configuration may couple semiconductor light emitting devices to a conductive adhesive layer to form a partition wall between the semiconductor light emitting devices. In other words, according to the present disclosure, the conductive adhesive layer may form a partition wall between semiconductor light emitting devices, thereby reducing the process of forming a partition wall in a separate manner. Through this, according to the present disclosure, a partition wall processing cost and fabrication equipment required for the partition wall process may not be needed, thereby simplifying the fabrication process of a display device, and increasing price competitiveness.

The technical effects of the present disclosure may not be necessarily limited to the foregoing description, and other technical effects thereof that is not described above will be clearly understood by those skilled in the art from the following description.

Advantageous Effects of Invention

According to the embodiments of the present invention disclosed in the present specification and drawings, a specific example is only presented to help the understanding of the present disclosure, but is not intended to limit the scope of the present disclosure. Moreover, it will be apparent to those skilled in this art that various modifications based on the technical concept of the present disclosure can be made thereto in addition to the embodiments disclosed herein.

BRIEF DESCRIPTION OF DRAWINGS

FIG. 1 is a conceptual view illustrating a display device using a semiconductor light emitting device according to an embodiment of the present disclosure;

FIG. 2 is a partial enlarged view of portion "A" in FIG. 1, and FIGS. 3A and 3B are cross-sectional views taken along lines B-B and C-C in FIG. 2;

FIG. 4 is a conceptual view illustrating a flip-chip type semiconductor light emitting device in FIG. 3A;

FIGS. 5A through 5C are conceptual views illustrating various forms for implementing colors in connection with a flip-chip type semiconductor light emitting device;

FIG. 6 is cross-sectional views illustrating a method of fabricating a display device using a semiconductor light emitting device according to the present disclosure;

FIG. 7 is a perspective view illustrating a display device using a semiconductor light emitting device according to another embodiment of the present disclosure;

FIG. 8 is a cross-sectional view taken along line C-C in FIG. 7;

FIG. 9 is a conceptual view illustrating a vertical type semiconductor light emitting device in FIG. 8;

FIG. 10 is a schematic view illustrating a display device using a semiconductor light emitting device according to an embodiment of the present disclosure;

FIG. 11 is a cross-sectional view taken along cut line A-A in FIG. 10;

FIG. 12 is a partial schematic view illustrating a conductive adhesive layer;

FIG. 13 is a cross-sectional view illustrating an example of a semiconductor light emitting device used in a display device;

FIGS. 14 through 17 are cross-sectional views illustrating a method of fabricating a display device using a semiconductor light emitting device according to an embodiment of the present disclosure;

FIG. 18 is a schematic view illustrating a display device using a semiconductor light emitting device according to another embodiment of the present disclosure;

FIG. 19 is a cross-sectional view taken along cut line A-A in FIG. 18;

FIG. 20 is a schematic view illustrating a display device using a semiconductor light emitting device according to still another embodiment of the present disclosure;

FIG. 21 is a cross-sectional view taken along cut line A-A in FIG. 20; and

FIG. 22 is a cross-sectional view illustrating an example of a semiconductor light emitting device used in a display device.

MODE FOR THE INVENTION

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments disclosed herein, moreover, the detailed description will be omitted when a specific description for publicly known technologies to which the invention pertains is judged to obscure the gist of the present invention. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device. However, the following illustration may be also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this case, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Referring to FIG. 5B, the semiconductor light emitting device may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 µm in the length of one side thereof, and formed with a rectangular or square shaped element. In case of a rectangular shaped element, the size thereof may be less than 20×80 µm.

Furthermore, even when a square shaped semiconductor light emitting device 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light emitting devices becomes sufficiently large. Accordingly, in this case, it may be possible to implement a flexible display device having a HD image quality.

A display device using the foregoing semiconductor light emitting device will be fabricated by a new type of fabrication method. Hereinafter, the fabrication method will be described with reference to FIG. 6.

FIG. 6 is cross-sectional views illustrating a method of fabricating a display device using a semiconductor light emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this case, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer (not shown).

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

FIG. 7 is a perspective view illustrating a display device using a semiconductor light emitting device according to another embodiment of the present disclosure. FIG. 8 is a cross-sectional view taken along line C-C in FIG. 7, and FIG. 9 is a conceptual view illustrating a vertical type semiconductor light emitting device in FIG. 8.

According to the drawings, the display device may be display device using a passive matrix (PM) type of vertical semiconductor light emitting device.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof. The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure.

A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it may be possible to implement a full color display in which the sub-pixels of red (R), green (G) and blue (B) implement one pixel by means of the semiconductor light emitting device.

Hereinafter, various embodiments of a display device using a semiconductor light emitting device will be described in more detail with reference to the accompanying drawings.

FIG. 10 is a schematic view illustrating a display device using a semiconductor light emitting device according to an embodiment of the present disclosure, and FIG. 11 is a cross-sectional view taken along cut line A-A in FIG. 10.

Referring to FIGS. 10 and 11, a display device using a semiconductor light emitting device may include a first substrate 1100, a conductive adhesive layer 1200 and a plurality of semiconductor light emitting devices 1300.

The first substrate 1100 may include an electrode portion 1110. The first substrate 1100 may be a wiring substrate. The electrode portion 1110 may include a plurality of first electrodes 1111 and second electrodes 1112. The first electrode 1111 may be a data electrode, and the second electrode 1112 may be a scan electrode. However, the present disclosure may not be necessarily limited to this, and for instance, the first electrode 1111 may be a scan electrode, and the second electrode 1112 may be a data electrode.

The material of the first substrate 1100 may include glass or polyimide (PI) to implement a flexible display device. In addition, any one may be used if it is an insulating and flexible material.

The conductive adhesive layer 1200 is located on the first substrate 1100. The conductive adhesive layer 1200 will be described in detail with reference to FIG. 12.

FIG. 12 is a partial schematic view illustrating a conductive adhesive layer.

The conductive adhesive layer 1200 may be configured with a layer allowing electrical interconnection in the z-direction passing through the thickness thereof but having electrical insulation in the horizontal x-y direction. Accordingly, the conductive adhesive layer 1200 may be referred to as a z-axis conductive layer.

Referring to FIG. 12, the conductive adhesive layer 1200 may be an anisotropic conductive film, and referred to as an anisotropic conductive film layer 1200 in the following examples (examples in FIGS. 12 through 22). However, the present disclosure may not be necessarily limited to this, and the conductive adhesive layer may be an anisotropic conductive paste, a solution containing conductive particles, and the like.

The anisotropic conductive film layer 1200 may include a non-transparent resin 1211, and a large number of particles in which conductive cores 1212 are coated by an insulating layer 1213 within the non-transparent resin 1211.

Accordingly, when pressure or heat is applied, the anisotropic conductive film layer 1200 is electrically connected to the core 1212 while the insulating layer 1213 is ruptured only on the applied portion.

At this time, the shape of the core 1212 is deformed to form a mutually contacting layer. Accordingly, the anisotropic conductive film layer 1200 may perform an adhesion function as well as electrically connection function.

Accordingly, the anisotropic conductive film layer 1200 may include a non-transparent resin 1211 to block light between the semiconductor light emitting devices 1300 which will be described later. In other words, it performs the role of a partition wall for blocking light between semiconductor light emitting devices 1300 at the same time.

For instance, the non-transparent resin 1211 may include a black or white resin.

On the other hand, the anisotropic conductive film layer 1200 may be tinted to block light between semiconductor light emitting devices 1300.

Referring to FIGS. 10 and 11 again, only a portion between the semiconductor light emitting device 1300 and the first electrode 1111 and second electrode 1112 is the anisotropic conductive film layer 1220 having conductivity, and the remaining portion is the anisotropic conductive film layer 1210 having no conductivity.

Accordingly, the anisotropic conductive film layer 1200 may allow mutual coupling as well as electrical connection between the semiconductor light emitting device 1300 and the first electrode 1111 and second electrode 1112.

At least part of the semiconductor light emitting device 1300 is buried in an upper region of the anisotropic conductive film layer 1200 to constitute individual pixels electrically connected to the electrode portion 1110.

Here, the semiconductor light emitting device 1300 may be preferably buried in an upper region of the anisotropic conductive film layer 1200 as a whole. In this manner, the anisotropic conductive film layer 1200 may be entirely buried, thereby maximizing an effect of blocking light between the semiconductor light emitting devices 1300.

The semiconductor light emitting device 1300 may have excellent luminance characteristics, and thus it may be possible to configure individual sub-pixels even with a small size thereof.

The size of the individual semiconductor light emitting device 150 may be less than 50 μm in the length of one side thereof, and formed with a rectangular or square shaped element.

Furthermore, even when a square shaped semiconductor light emitting device 1300 with a length of side of 10 μm is used for a sub-pixel, it will exhibit a sufficient brightness for implementing a display device.

Accordingly, for example, in case of a rectangular pixel in which one side of a sub-pixel is 600 μm in size, and the remaining one side thereof is 300 μm, a relative distance between the semiconductor light emitting devices becomes sufficiently large.

Accordingly, in this case, it has an effect capable of implementing a flexible display device.

FIG. 13 is a cross-sectional view illustrating an example of a semiconductor light emitting device used in a display device. Referring to FIG. 13, the semiconductor light emitting device 1300 has a horizontal structure.

The horizontal semiconductor light emitting device 1300 may include an n-type semiconductor layer 1310, an active layer 1320 formed on the n-type semiconductor layer 1310, a p-type semiconductor layer 1330 formed on the active layer 1320, a p-type electrode 1340 formed on the p-type semiconductor layer 1330, and an n-type electrode 1350 formed on an exposed surface of the n-type semiconductor layer 1310.

In this case, the semiconductor light emitting device 1300 may be electrically connected to the first electrode 1111 and second electrode 1112 of the first substrate 1100 in a flip chip bonding manner.

On the other hand, a nitride-based semiconductor light emitting device may be used for the semiconductor light emitting device 1300.

The nitride-based semiconductor light emitting device implements a high-power light emitting device that emits various lights including blue in which gallium nitride (GaN) is mostly used, and indium (In) and/or aluminum (Al) are added thereto.

FIGS. 14 through 17 are cross-sectional views illustrating a method of fabricating a display device using a semiconductor light emitting device according to an embodiment of the present disclosure.

Referring to FIG. 14, the anisotropic conductive film layer 1200 containing a non-transparent resin is adhered to the first substrate 1100 including the electrode portion 1110. The electrode portion 1110 herein may include a plurality of first electrodes 1111 and second electrodes 1112.

Accordingly, an anisotropic conductive film may be coated on the first substrate 1100 located with a plurality of first electrodes 1111 and second electrodes 1112 to form the anisotropic conductive film layer 1200.

The anisotropic conductive film layer 1200 may contain a non-transparent resin 1211.

Next, the second substrate 1101 located with a plurality of semiconductor light emitting devices 1300 corresponding to the location of the electrode portion 1110 and constituting individual pixels is disposed such that the electrode portion 1110 faces the semiconductor light emitting device 1300. Here, the second substrate 1101 may be a growth substrate for growing the semiconductor light emitting device 1300.

Referring to FIGS. 15 and 16, the first substrate 1100 is thermally compressed to the second substrate 1101 to bury at least part of the semiconductor light emitting device 1300 in an upper region of the anisotropic conductive film layer 1200.

Accordingly, the first substrate 1100 is bonded to the second substrate 1101. In addition, Only a portion between the first electrode 1111 and second electrode 1112 and the semiconductor light emitting device 1300 may have conductivity due to the characteristics of an anisotropic conductive film having conductivity by thermal compression.

Accordingly, the electrode portion 1110 and second electrode 1112 may be electrically connected to the semiconductor light emitting device 1300.

For example, the electrode portion 1110 and second electrode 1112 may be thermally compressed by applying an ACF press head.

On the other hand, the semiconductor light emitting device 1300 may be preferably buried in an upper region of the anisotropic conductive film layer 1200 as a whole.

It may be possible to perform the role of blocking light from being moved between semiconductor light emitting devices 1300 since the anisotropic conductive film layer 1200 contains a non-transparent resin. In other words, with no additional partition wall fabrication process, a partition wall may be formed between the semiconductor light emitting devices 1300 through the process of thermally compressing the first substrate 1100 to the second substrate 1101.

Accordingly, it may be possible to simplify a partition wall process between the semiconductor light emitting devices 1300.

Referring to FIG. 17, the second substrate 1101 is removed. For example, the second substrate 1101 may be removed using a laser lift-off (LLO) or chemical lift-off (CLO) method.

FIG. 18 is a schematic view illustrating a display device using a semiconductor light emitting device according to another embodiment of the present disclosure, and FIG. 19 is a cross-sectional view taken along cut line A-A in FIG. 18.

Referring to FIGS. 18 and 19, it is illustrated the design of a full color display to which a phosphor layer is applied to a PM type semiconductor light emitting device array.

A display device using a semiconductor light emitting device may include a first substrate 1100 including a electrode portion 1110, an anisotropic conductive film layer 1200, a semiconductor light emitting device 1300 and a phosphor layer 1400. The electrode portion 1110 information a plurality of first electrodes 1111 and second electrodes 1112.

In other words, a plurality of first electrodes 1111 and second electrodes 1112 are located on the first substrate 1100, and the anisotropic conductive film layer 1200 is located thereon.

The anisotropic conductive film layer 1200 may include a non-transparent resin to block light between the semiconductor light emitting devices 1300 which will be described later. In other words, it performs the role of a partition wall for blocking light between semiconductor light emitting devices 1300 at the same time.

For instance, the non-transparent resin may include a black or white resin.

On the other hand, the anisotropic conductive film layer 1200 may be tinted to block light between semiconductor light emitting devices 1300.

Furthermore, at least part of semiconductor light emitting devices 1300 buried therein is located in an upper region of the anisotropic conductive film layer 1200. The semiconductor light emitting devices 1300 are electrically connected to the first electrode 1111 and second electrode 1112, which is the electrode portion 1110, to constitute individual pixels.

In addition, the phosphor layer 1400 is located on the semiconductor light emitting device 1300.

For example, the semiconductor light emitting device 1300 is a blue semiconductor light emitting device that emits blue (B) light, and may be provided with the phosphor layer 1400 for converting the blue (B) light into the color of a sub-pixel. Here, the phosphor layer 1400 may be a red phosphor layer 1401 or green phosphor layer 1402 constituting individual pixels.

In other words, a red phosphor 1401 capable of converting blue light into red (R) light may be provided on the blue semiconductor light emitting device at a location implementing one sub-pixel, and a green phosphor 1402 capable of converting blue light into green (G) light may be provided on the blue semiconductor light emitting device at a location implementing another sub-pixel.

Furthermore, only the blue semiconductor light emitting device 1403 may be solely used at a location implementing a blue sub-pixel.

Here, a black matrix (BM) may be provided between each phosphor to enhance contrast. In other words, the black matrix may maximize the contrast of luminance.

Accordingly, red and green phosphors may be applied to a blue semiconductor light emitting device to design a full color display.

On the other hand, according to circumstances, the semiconductor light emitting device 1300 may be of course provided with a white light emitting device having a yellow phosphor layer for each device, and in this case, a red phosphor, a green phosphor and a blue phosphor may be provided to implement each sub-pixel (not shown).

Furthermore, a color filter repeated with red, green and blue may be used instead of a phosphor layer on such a white light emitting device to configure a pixel. Here, it may further include a black matrix between color filters to enhance contrast.

Moreover, red, green and blue phosphors may be applied to a blue semiconductor light emitting device to design a full color display using red (R), green (G) and blue (B) sub-pixels as a unit pixel. Through such a structure, low power may be accomplished by maximizing a high efficiency of the blue semiconductor light emitting device and yellow phosphor during full white.

FIG. 20 is a schematic view illustrating a display device using a semiconductor light emitting device according to still another embodiment of the present disclosure, and FIG. 21 is a cross-sectional view taken along cut line A-A in FIG. 20.

Referring to FIGS. 20 and 21, a display device using a semiconductor light emitting device illustrates a display device using a passive matrix (PM) type semiconductor light emitting device.

The display device using a semiconductor light emitting device may include a first substrate 1100, a first electrode 1111, an anisotropic conductive film layer 1200, a semiconductor light emitting device 1300, and a second electrode 1112.

The first substrate 1100 as a wiring substrate disposed with the first electrode 1111 may include glass or polyimide (PI) to implement a flexible display device. In addition, any one may be used if it is an insulating and flexible material.

The first electrode 1111 may perform the role of a data electrode, and be located on the first substrate 1100. For instance, a plurality of first electrodes 1111 may be disposed at predetermined intervals on the substrate. The first electrode 1111 may be a bar-shaped electrode.

The anisotropic conductive film layer 1200 is located on the first substrate 1100 located with the first electrode 1111.

The anisotropic conductive film layer 1200 may allow mutual coupling as well as electrical connection between the semiconductor light emitting device 1300 and the first electrode 1111.

Furthermore, the anisotropic conductive film layer 1200 may include a non-transparent resin to block light between the semiconductor light emitting devices 1300. In other words, the anisotropic conductive film layer 1200 performs the role of a partition wall for blocking light between semiconductor light emitting devices 1300.

For instance, the non-transparent resin may include a black or white resin.

On the other hand, the anisotropic conductive film layer 1200 may be tinted to block light between semiconductor light emitting devices 1300.

The semiconductor light emitting devices 1300 constitute individual pixels, and at least part thereof are buried in an upper region of the anisotropic conductive film layer 1200.

Furthermore, the semiconductor light emitting device 1300 is electrically connected to the first electrode 1111. For instance, they can be electrically connected to each other since the region of the anisotropic conductive film layer 1200 located between the first electrode 1111 and semiconductor light emitting device 1300 has conductivity. Here, the semiconductor light emitting device 1300 may be preferably disposed to be located on the first electrode 1111.

On the other hand, the semiconductor light emitting device 1300 herein may have a vertical structure.

Hereinafter, the vertical semiconductor light emitting device will be described in detail.

FIG. 22 is a cross-sectional view illustrating an example of a semiconductor light emitting device used in a display device. Referring to FIG. 22, the semiconductor light emitting device has a vertical structure.

The vertical semiconductor light emitting device 1300 may include an p-type electrode 1340, a p-type semiconductor layer 1330 located on the p-type electrode 1340, an active layer 1320 located on the p-type semiconductor layer 1330, a n-type semiconductor layer 1310 located on the active layer 1320, and an n-type electrode 1350 located on the n-type semiconductor layer 1310.

In this case, the p-type semiconductor layer 1340 located at a lower portion thereof may be electrically connected to the first electrode 1111 by means of the anisotropic conductive film layer 1200, and the n-type electrode 1350 located at an upper portion thereof may be electrically connected to the second electrode 1112 which will be described later.

The vertical semiconductor light emitting device may allow an electrode to be disposed in the vertical direction, thereby obtaining an advantage of reducing the chip size.

Referring to FIGS. 20 and 21 again, the second electrode 1112 is located between the semiconductor light emitting devices 1300, and electrically connected to the semiconductor light emitting devices 1300.

For example, the semiconductor light emitting devices 1300 may be disposed in a plurality of rows, and the second electrode 1112 may be located between the rows of the semiconductor light emitting devices 1300. Since a distance between the semiconductor light emitting devices 1300 constituting individual pixels is sufficiently large, the second electrode 1112 may be located between the semiconductor light emitting devices 1300.

The second electrode 1112 may be a bar-shaped electrode. For example, the first electrode 1111 and second electrode 1112 may be disposed in a perpendicular direction to each other. Accordingly, it may have a PM type structure.

Furthermore, the second electrode 1112 may be electrically connected to the semiconductor light emitting device 1300 by a connecting electrode 1113 protruded from the second electrode 1112.

For instance, when the semiconductor light emitting device 1300 has a vertical structure, the second electrode 1112 may be electrically connected to an n-type electrode of the semiconductor light emitting device 1300 by means of the connecting electrode 1113.

The second electrode 1112 may be immediately located on the anisotropic conductive film layer.

On the other hand, when the second electrode 1112 is located on the semiconductor light emitting device 1300, a transparent electrode such as indium tin oxide (ITO) should be used, but the ITO material has a problem with a bad adhesiveness to an n-type semiconductor layer.

Accordingly, according to the present disclosure, the second electrode 1112 may be located between semiconductor light emitting devices 1300, thereby obtaining an advantage in which a transparent electrode such as ITO is not necessarily used.

Accordingly, an n-type semiconductor layer and a conductive material having a good adhesiveness may be used as a horizontal electrode without being restricted by the selection of a transparent material, thereby enhancing the light extraction efficiency.

Accordingly, individual sub-pixels may be configured even with a small size using the semiconductor light emitting device 1300, and a distance between the semiconductor light emitting devices 1300 may be relatively sufficiently large to locate the second electrode 1112 between the semiconductor light emitting devices 1300, thereby having the effect of implementing a flexible display device.

Furthermore, a semiconductor light emitting device array layout structure may be simplified using the anisotropic conductive film layer 1200. In particular, in case of a vertical semiconductor light emitting device, it may have a simpler layout design.

According to the present disclosure, the anisotropic conductive film layer 1200 may perform even the role of a partition wall between semiconductor light emitting devices 1300. Accordingly, it may be possible to provide a display device in which a partition wall process between the semiconductor light emitting devices 1300 is simplified.

Accordingly, a resultant processing cost and fabrication equipment required for the partition wall process may not be additionally needed, thereby providing a fabrication process in favour of mass production yield and low cost.

On the other hand, according to the embodiments of the present invention disclosed in the present specification and drawings, a specific example is only presented to help the understanding of the present disclosure, but is not intended to limit the scope of the present disclosure. Moreover, it will be apparent to those skilled in this art that various modifications based on the technical concept of the present disclosure can be made thereto in addition to the embodiments disclosed herein.

The invention claimed is:

1. A display device, the display device comprising:
a substrate;
a first electrode disposed on the substrate and having a plurality of first electrode lines arranged in a row direction;
an insulating layer configured to overlap the substrate comprising the first electrode;
a second electrode disposed on the insulating layer and having a plurality of second electrode lines arranged in a column direction, wherein the first electrode and the second electrode are arranged in a perpendicular direction to each other;
a conductive adhesive layer located on the insulating layer;
a plurality of semiconductor light emitting devices at least part of which are buried in the conductive adhesive layer to constitute individual pixels electrically connected to the first electrode and the second electrode; and
a phosphor layer disposed to overlap at least part of the plurality of semiconductor light emitting devices,
wherein each of color phosphor included in the phosphor layer is arranged along each line of one of the first electrode and the second electrode.

2. The display device of claim 1,
wherein the conductive adhesive layer contains a non-transparent resin to block light between the semiconductor light emitting devices, and
wherein the non-transparent resin comprises a black or white resin.

3. The display device of claim 1, wherein the conductive adhesive layer is tinted.

4. The display device of claim 1,
wherein the semiconductor light emitting device is flip-chip-bonded to the first electrode and second electrode.

5. The display device of claim 1, wherein the second electrode is located at an opposite side to the first electrode.

6. The display device of claim 5, wherein the semiconductor light emitting device is a vertical light emitting device coupled between the first electrode and second electrode.

7. The display device of claim 1, wherein the semiconductor light emitting device is a blue light emitting device, and
the phosphor layer is a red phosphor and a green phosphor constituting individual pixels.

8. The display device of claim 7, wherein the phosphor layer further comprises a black matrix located between each phosphor.

9. The display device of claim 1, wherein the semiconductor light emitting device is a blue light emitting device, and the phosphor layer is a yellow phosphor layer.

10. The display device of claim 9, further comprising:
a color filter in which red, green and blue are repeated on the yellow phosphor layer.

11. The display device of claim 10, further comprising:
a black matrix located between the color filters.

12. The display device of claim 1, further comprising:
an auxiliary electrode placed on the insulating layer, and
an electrode hole passing through the insulating layer,
wherein the plurality of semiconductor light emitting devices are electrically connected to the first electrode through an electrical connection formed by the auxiliary electrode and the electrode hole.

* * * * *